(12) United States Patent
Wu

(10) Patent No.: US 10,779,428 B2
(45) Date of Patent: Sep. 15, 2020

(54) CHIP CARD ASSEMBLY FOR ELECTRONIC DEVICE

(71) Applicant: HON HAI PRECISION INDUSTRY CO., LTD., New Taipei (TW)

(72) Inventor: Hsin-Di Wu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 308 days.

(21) Appl. No.: 15/868,044

(22) Filed: Jan. 11, 2018

(65) Prior Publication Data

US 2019/0082548 A1 Mar. 14, 2019

(30) Foreign Application Priority Data

Sep. 11, 2017 (CN) .......................... 2017 1 0814193

(51) Int. Cl.
| | |
|---|---|
| *H05K 1/14* | (2006.01) |
| *H05K 5/02* | (2006.01) |
| *H01F 7/06* | (2006.01) |
| *H01F 7/14* | (2006.01) |
| *H04B 1/3818* | (2015.01) |
| *G06K 13/08* | (2006.01) |
| *H01F 7/16* | (2006.01) |

(52) U.S. Cl.
CPC ....... *H05K 5/0295* (2013.01); *G06K 13/0831* (2013.01); *H01F 7/064* (2013.01); *H01F 7/14* (2013.01); *H01F 7/1646* (2013.01); *H04B 1/3818* (2015.01); *H05K 5/0221* (2013.01); *G06K 13/0868* (2013.01)

(58) Field of Classification Search
USPC ........................................................ 361/737
See application file for complete search history.

(56) References Cited

U.S. PATENT DOCUMENTS

| | | | |
|---|---|---|---|
| 2012/0162925 A1* | 6/2012 | Luo .................... | G06K 13/0825 361/727 |
| 2013/0286608 A1* | 10/2013 | Liang .................. | H05K 7/1402 361/754 |
| 2018/0316378 A1* | 11/2018 | Zhao .................... | H04B 1/3816 |

* cited by examiner

Primary Examiner — Hung S. Bui
(74) Attorney, Agent, or Firm — SciencBiziP, P.C.

(57) ABSTRACT

A chip card assembly of an electronic device includes a casing defining an opening, a connector received inside the casing and including a tray, an electromagnet driving assembly including at least one electromagnet and a pushing member, and a control unit configured to control the electromagnet driving assembly to drive the pushing member to push the tray out of the opening. The tray includes a cover for covering the opening.

9 Claims, 9 Drawing Sheets

CHIP CARD ASSEMBLY FOR ELECTRONIC DEVICE

FIELD

The subject matter herein generally relates to chip card assemblies, and more particularly to a chip card assembly of an electronic device.

BACKGROUND

Generally, a chip card assembly of an electronic device requires a special tool to open or must be manually opened to retrieve a SIM card.

BRIEF DESCRIPTION OF THE DRAWINGS

Implementations of the present disclosure will now be described, by way of example only, with reference to the attached figures.

DETAILED DESCRIPTION

Figure 1:
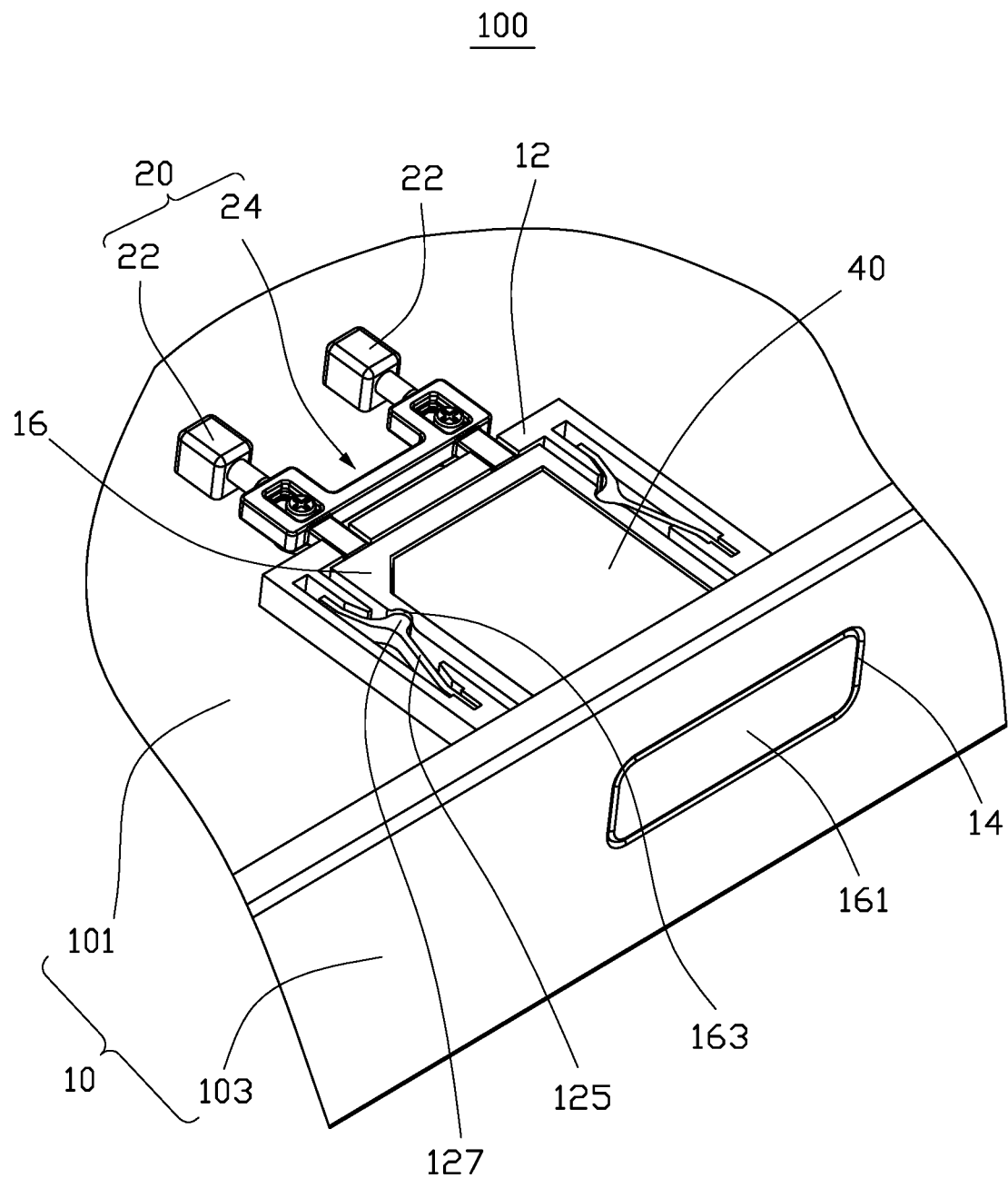
FIG. 1 is an isometric cutaway view of a first exemplary embodiment of a chip card assembly of an electronic device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected.

In general, the word "module" as used hereinafter refers to logic embodied in hardware or firmware, or to a collection of software instructions, written in a programming language such as, for example, Java, C, or assembly. One or more software instructions in the modules may be embedded in firmware such as in an erasable-programmable read-only memory (EPROM). It will be appreciated that the modules may comprise connected logic units, such as gates and flip-flops, and may comprise programmable units, such as programmable gate arrays or processors. The modules described herein may be implemented as either software and/or hardware modules and may be stored in any type of computer-readable medium or other computer storage device.

FIGS. 1-5 illustrate an exemplary embodiment of a chip card assembly 100 of an electronic device. In FIG. 1, the chip card assembly 100 may include a casing 10, an electromagnet driving assembly 20, and a control unit 30 (shown in FIG. 9). The casing 10 may include a connector 12 therein and define an opening 14. The casing 10 may include a bottom plate 101 and a side plate 103, and the connector 12 may be arranged on the bottom plate 101. The opening 14 may be defined in the side plate 103. The connector 12 may be adjacent to the opening 14. The connector 12 may include a tray 16 and is arranged corresponding to the electromagnet driving assembly 20. The electromagnet driving assembly 20 may include at least one electromagnet 22 and a pushing member 24. The pushing member 24 is arranged corresponding to the at least one electromagnet 22. The pushing member 24 is arranged corresponding to the tray 16. The tray 16 may include a cover 161 for covering the opening 14. The tray 16 may accommodate a chip card 40. The control unit 30 may control the electromagnet 22 to drive the pushing member 24 to move, thereby pushing the tray 16 out of the opening 14.

Figure 2:
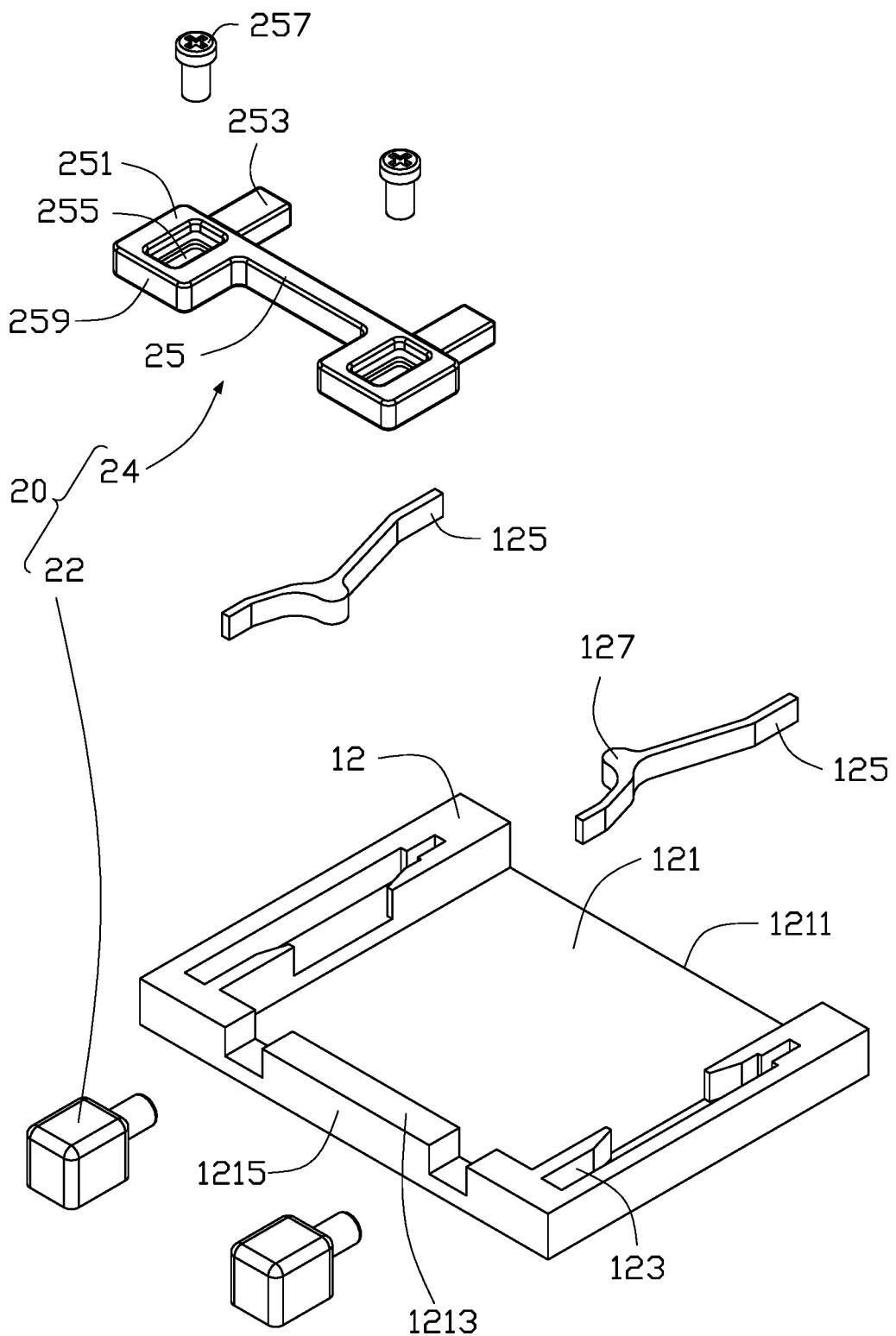
FIG. 2 is an isometric exploded view of the chip card assembly of FIG. 1.

In FIG. 2, the connector 12 defines an accommodating space 121 and a pair of channels 123. The pair of channels 123 is defined on either side of the accommodating space 121. The tray 16 is received in the accommodating space 121. Each of the channels 123 may receive a corresponding resilient member 125. Each resilient member 125 may include a fixing block 127 protruding out of the channel 123 and into the accommodating space 121. The fixing block 127 may latch in a concave surface 163 (shown in FIG. 1) to latch the tray 16. The connector 12 may include an open end 1211 and a closed end 1213. The open end 1211 is adjacent to the opening 14 and communicates with the accommodating space 121. The closed end 1213 is opposite from the open end 1211 and is coupled to the pushing member 24. In a first embodiment, the pushing member 24 is a sliding member 25 that may slide to push the tray 16. The sliding member 25 may include a main body 251 and a pair of pushing rods 253 extending from a surface of the main body 251 facing a limiting surface 1215 of the connector 12. The limiting surface 1215 is an outer surface of the closed end 1213. The limiting surface 1215 can limit a sliding movement of the sliding member 25. The closed end 1213 may define a pair of chutes 129 corresponding to the pair of pushing rods 253. The pair of pushing rods 253 is received in the pair of chutes 129 and may slide along the pair of chutes 129 to push the tray 16 (shown in FIG. 3).

Figure 3:
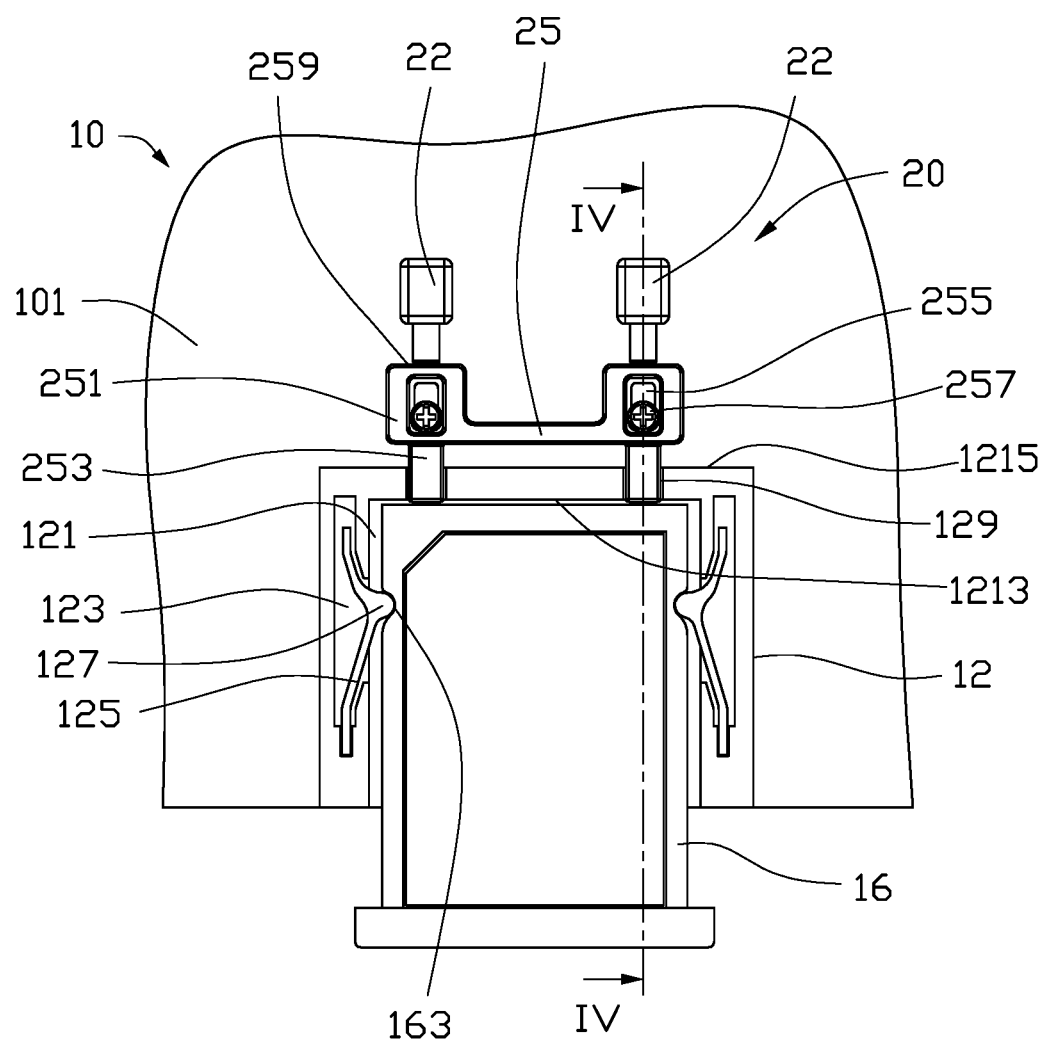
FIG. 3 is a top view of the chip card assembly of FIG. 1.
Figure 4:
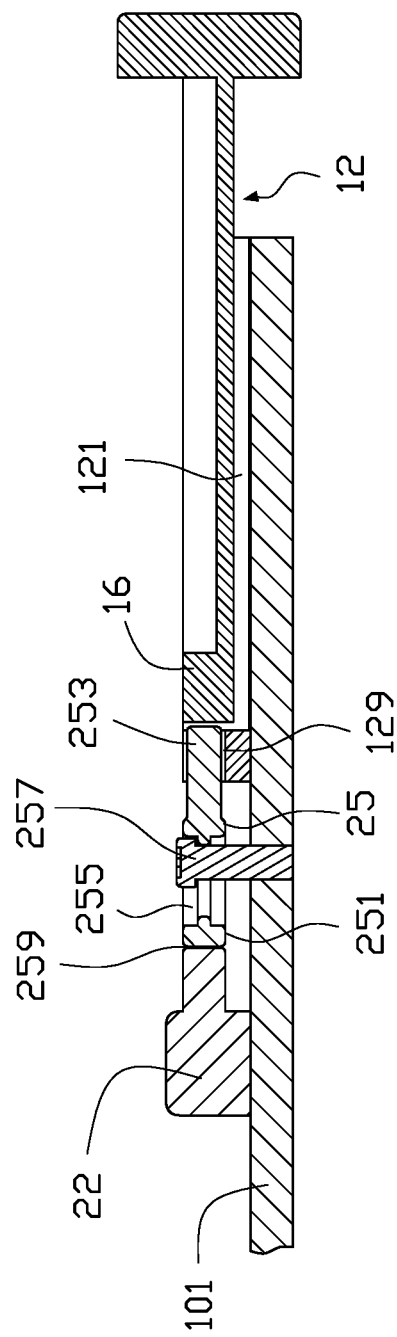
FIG. 4 is a side view of the chip card assembly.
Figure 5:
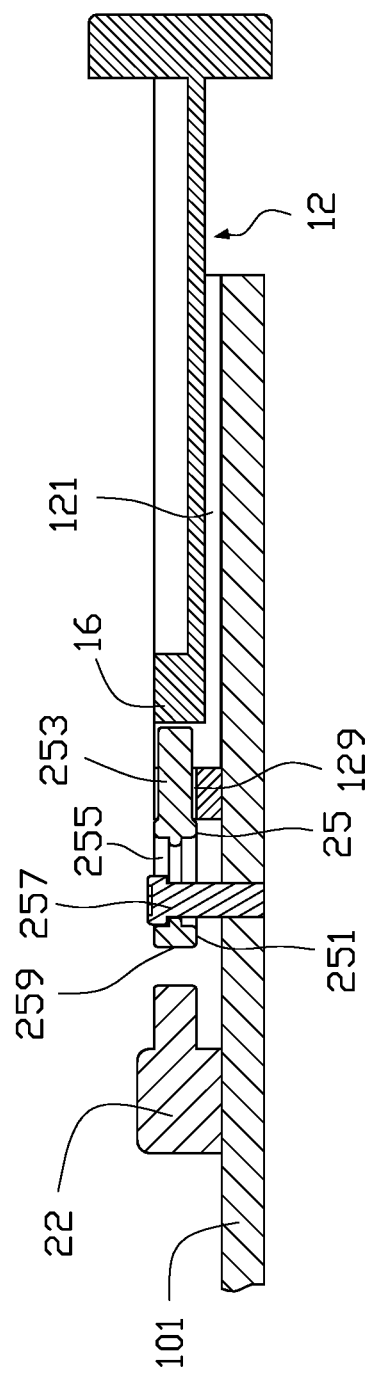
FIG. 5 is a side view of the chip card assembly in another state of use.

In FIG. 3, the main body 251 of the sliding member 25 may define a pair of sliding grooves 255. The sliding member 25 may be slidable coupled to an inner surface of the casing 10 through a corresponding pair of bolts 257 received in the pair of sliding grooves 255. In at least one embodiment, the electromagnet 22 is a pair of electromagnets, and a corresponding pair of magnets 259 may be arranged on an outer surface of the sliding member 25 to face the pair of electromagnets. A magnetic force between the pair of electromagnets and the magnets 259 may drive the sliding member 25 to slide along the sliding grooves 255 to push the tray 16. When the electromagnet 22 is not powered on, the pair of electromagnets attracts the magnets 259 to hold the sliding member 25 in position (shown in FIG. 4). The resilient members 125 latching the tray hold the tray 16 in position. When the control unit 30 controls the electromagnet 22 to turn on, the electromagnet 22 generates a repelling force on the magnets 259 to drive the sliding member 25 to slide along the sliding grooves 255, and the pushing rods 253 push the tray 16 (shown in FIG. 5). The repelling force is strong enough to overcome a resilient force of the resilient members 125, thereby unlatching the tray 16 from the resilient members 125 and pushing the tray 16 out of the opening 14. Thus, the tray 16 may be automatically ejected from the casing 10 through the opening 14 by the repelling force, thereby making it easier to remove the tray 16. The cover 161 of the tray 16 may also allow a user to easily remove the tray 16 from the opening 14. The cover 161 may enhance a seamless surface on the casing 10. A waterproof coating may be applied on and around the cover 161 to improve water resistivity of the chip card assembly 100.

Figure 6:
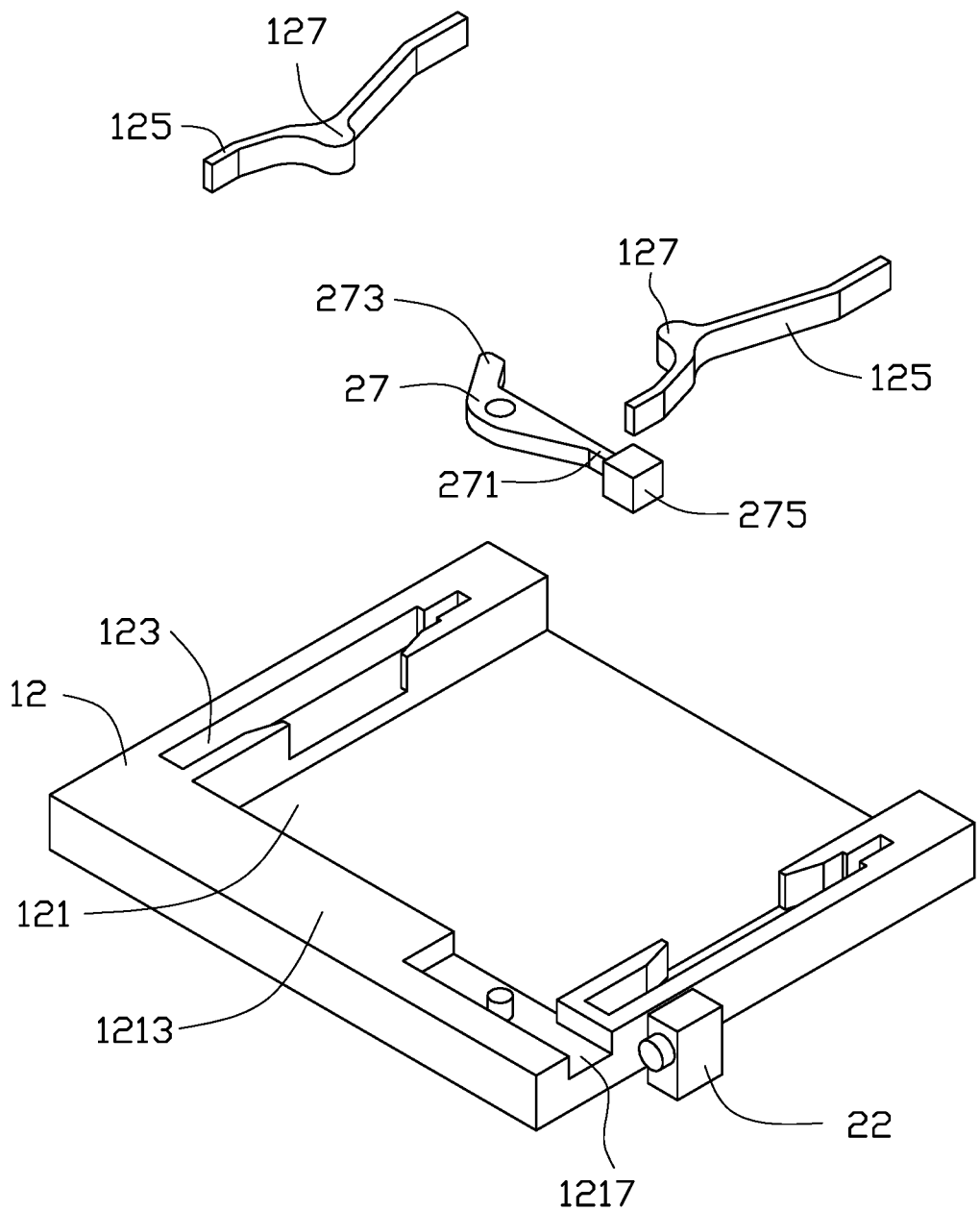
FIG. 6 is an isometric exploded view of a second exemplary embodiment of a chip card assembly.
Figure 7:
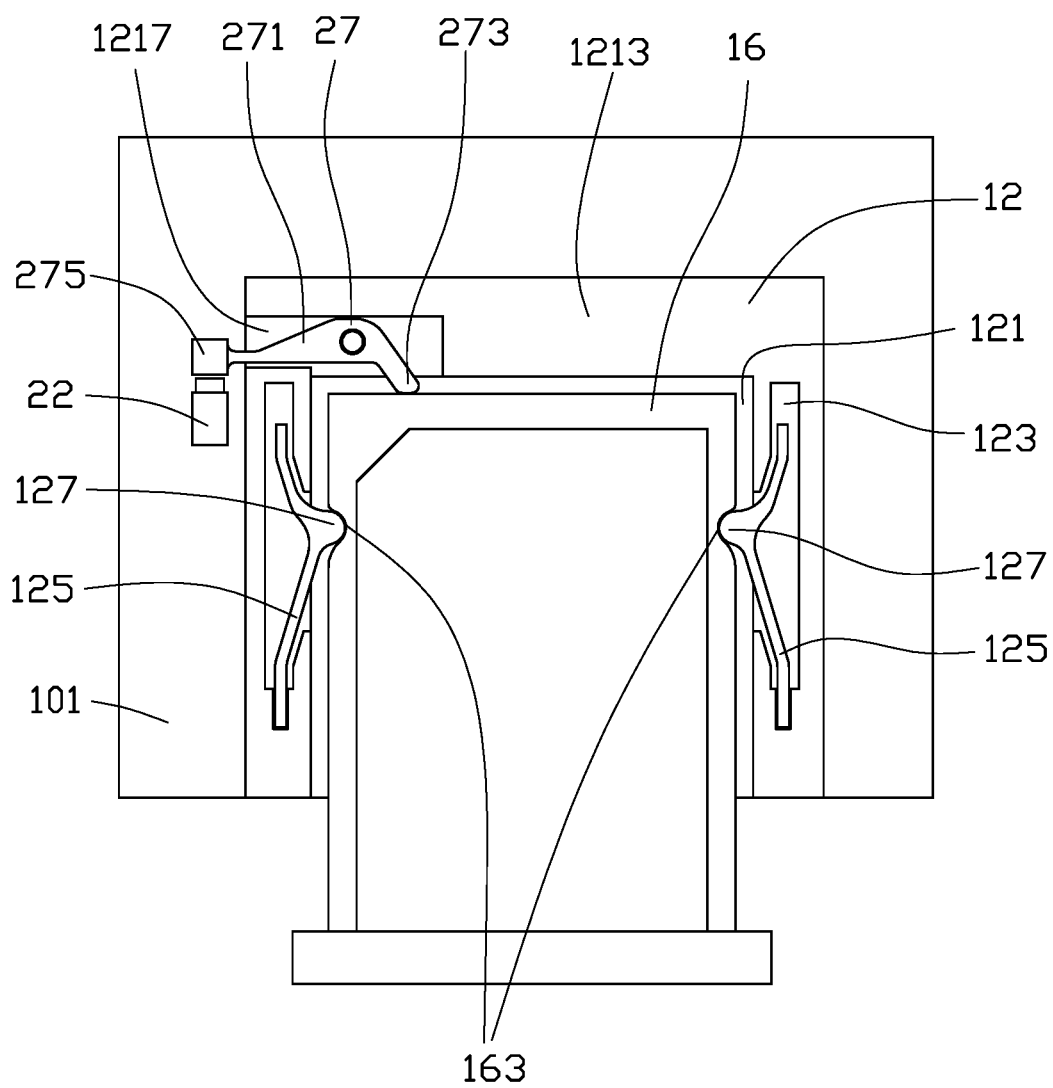
FIG. 7 is an assembled top view of the chip card assembly of FIG. 6.
Figure 8:
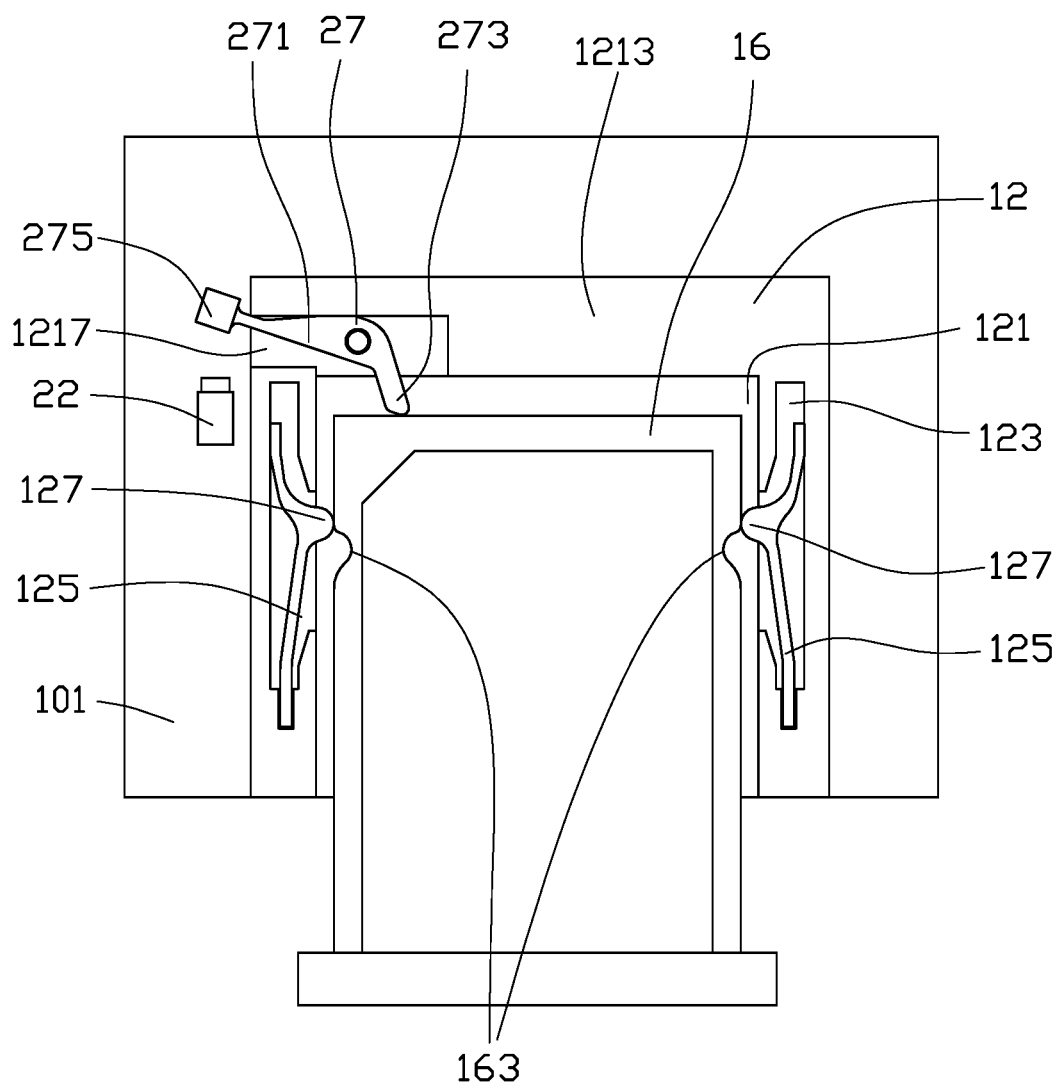
FIG. 8 is a top view of the chip card assembly of FIG. 7 in another state of use.

FIGS. 6-8 illustrate another exemplary embodiment of the chip card assembly 100. In the second embodiment, the pushing member 24 is a swinging member 27. The connector 12 may define a swinging groove 1217 in a side of the closed end 1213. The swinging member 27 is hinged in the swinging groove 1217. The swinging member 27 includes a driving end 271 and a pushing end 273. The driving end 271 protrudes out of an outer side of the swinging groove 1217. The pushing end 273 protrudes out of an inner side of the swinging groove and corresponds to the tray. The driving end 271 is driven to rotate the swinging member 27 to cause the pushing end 273 to push the tray 16. In detail, the driving end 271 includes a magnet 275, and an electromagnet 22 is arranged facing the magnet 275. The repelling force between the electromagnet 22 and the magnet 275 drives the driving end 271 to rotate the swinging member 27.

When the electromagnet 22 is not powered on, the electromagnet 22 attracts the magnet 275 to prevent the swinging member 27 from rotating, and the resilient members 125 latch the tray 16 in position in the accommodating space 121 (shown in FIG. 7). When the control unit 30 controls the electromagnet 22 to power on, the repelling force drives the swinging member 27 to rotate, thereby pushing the tray 16. A force of the swinging member 27 pushing the tray 16 may overcome a resilient force of the resilient members 125, and the tray 16 may be automatically ejected from the casing 10 through the opening 14 (shown in FIG. 8).

Figure 9:
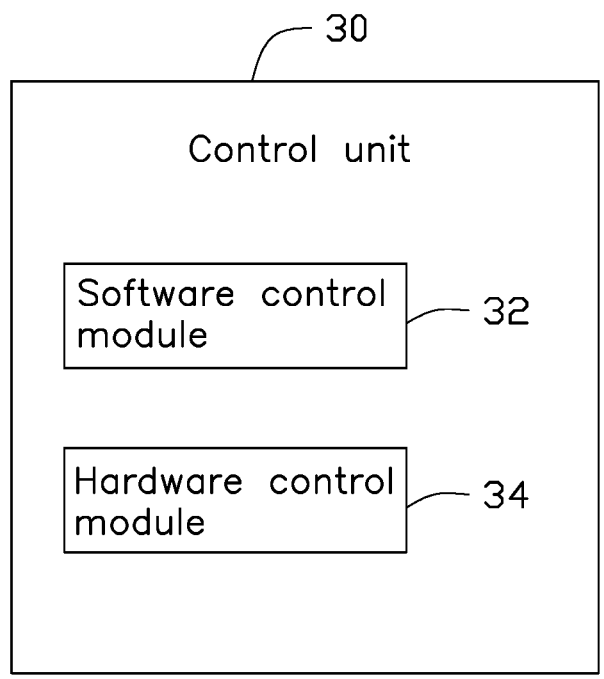
FIG. 9 is a diagram of a control unit of the electronic device.

Referring to FIG. 9, the control unit 30 may include a software control module 32 and a hardware control module 34. The control unit 30 may be a central processing unit, a microprocessing unit, or other data processing chip used for storing instructions of the software control module 32 and the hardware control module 34 which are driving programs. In at least one embodiment, when the electronic device is powered off, the hardware control module 34 may eject the tray 16 in response to user operations on the electronic device. For example, when a power button and a volume button of the electronic device are pressed at the same time and held for a predefined time duration, the hardware control module 34 may power on the electromagnet 22 to eject the tray 16. In at least one embodiment, when the electronic device is powered on, the software control module 34 may eject the tray 16 in response to user operations on the electronic device. For example, a user may select a virtual button on the electronic device to cause the software control module 32 to power on the electromagnet 22 to eject the tray 16. In another embodiment, the software control module 32 may power on the electromagnet 22 to eject the tray 16 after a predefined time duration after powering off the electronic device.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A chip card assembly of an electronic device, the chip card assembly comprising:
   a casing defining an opening;
   a connector received inside the casing and comprising a tray, the tray comprising a cover covering the opening;
   an electromagnet driving assembly comprising at least one electromagnet and a pushing member; and
   a control unit configured to control the electromagnet driving assembly to drive the pushing member to push the tray out of the opening;
   an accommodating space is defined in the connector;
   a pair of channels is defined in the tray on opposite sides of the accommodating space; the accommodating space receives the tray;
   a resilient member is received in each of the channels;
   the resilient member comprises a fixing block for latching in a corresponding concave surface defined in the tray.

2. The chip card assembly of claim 1, wherein the connector comprises an open end and a closed end; the open end is adjacent to the opening, and the closed end is opposite to the open end and away from the opening; the pushing member is arranged at the closed end.

3. The chip card assembly of claim 2, wherein:
   the pushing member is slidable and comprises a main body and a pair of pushing rods;
   the closed end of the connector comprises a limiting end face and defines a pair of chutes; the pair of pushing rods protrudes from a surface of the main body facing the limiting end face of the connector;
   the pair of pushing rods is accommodated within the pair of chutes to slide along the pair of chutes to push the tray; the limiting end face abuts against the main body to limit a sliding movement of the pushing member.

4. The chip card assembly of claim 3, wherein:
   a pair of sliding grooves is defined in the main body; a pair of bolts is received in the pair of sliding grooves to slidably couple the pushing member to the casing;
   the casing comprises a pair of electromagnets, and the pushing member comprises a pair of magnets arranged on a surface of the pushing member facing the pair of electromagnets;
   the pushing member is driven to slide to push the tray by a magnetic force between the pair of electromagnets and the pair of magnets.

5. The chip card assembly of claim 2, wherein:
   the pushing member is rotatable; the pushing member is hinged in a swinging groove defined in a side of the closed end of the connector;
   the pushing member comprises a driving end and a pushing end; the driving end protrudes out of an outer side of the swinging groove;

the pushing end protrudes out of an inner side of the swinging groove and corresponds to the tray; the driving end drives the pushing member to rotate to cause the pushing end to push the tray.

6. The chip card assembly of claim 5, wherein:
the driving end comprises a magnet;
an outer surface of the connector comprises an electromagnet; the pushing member is driven to rotate to push the tray by a magnetic force between the magnet and the electromagnet.

7. The chip card assembly of claim 1, wherein the control unit is configured to control the electromagnet driving assembly to drive the pushing member to push the tray out of the opening when the electronic device is powered on.

8. The chip card assembly of claim 7, wherein the control unit is configured to control the electromagnet driving assembly to drive the pushing member to push the tray out of the opening after a predefined time duration when the electronic device is powered off.

9. The chip card assembly of claim 1, wherein the control unit is configured to control the electromagnet driving assembly to drive the pushing member to push the tray out of the opening when the electronic device is powered off and one or more predefined buttons of the electronic device are pressed.

\* \* \* \* \*